United States Patent
Blaesing-Bangert et al.

(10) Patent No.: US 6,377,870 B1
(45) Date of Patent: Apr. 23, 2002

(54) DEVICE AND METHOD FOR DELIVERING VARIOUS TRANSPARENT SUBSTRATES INTO A HIGH-PRECISION MEASURING INSTRUMENT

(75) Inventors: Carola Blaesing-Bangert, Huettenberg; Ulrich Kaczynski, Bad Nauheim, both of (DE)

(73) Assignee: Leica Microsystems Wetzlar GmbH, Wetzlar (DE)

( * ) Notice: Subject to any disclaimer, the term of this patent is extended or adjusted under 35 U.S.C. 154(b) by 0 days.

(21) Appl. No.: 09/685,095

(22) Filed: Oct. 11, 2000

(30) Foreign Application Priority Data

Oct. 11, 1999 (DE) .......................................... 199 49 005

(51) Int. Cl.$^7$ ............................................. G06F 19/00
(52) U.S. Cl. .................... 700/245; 396/604; 396/611; 430/5; 451/8; 118/69; 165/80.1; 356/401
(58) Field of Search .......................... 700/245; 396/604, 396/611; 369/275.1, 275.3; 356/401, 399, 400; 427/346, 443.1; 156/345; 165/80.1; 430/5, 30, 22; 355/53, 67, 68, 74; 451/6, 8; 118/69

(56) References Cited

U.S. PATENT DOCUMENTS

| | | | | |
|---|---|---|---|---|
| 4,949,783 A | * | 8/1990 | Lakios et al. | 165/80.1 |
| 5,026,239 A | | 6/1991 | Chiba et al. | |
| 6,004,047 A | * | 12/1999 | Akimoto et al. | 396/604 |
| 6,040,096 A | * | 3/2000 | Kakizaki et al. | 430/5 |
| 6,122,036 A | * | 9/2000 | Yamasaki et al. | 355/53 |
| 6,132,289 A | * | 10/2000 | Labunsky et al. | 451/6 |
| 6,244,931 B1 | * | 6/2001 | Pinson et al. | 451/8 |

* cited by examiner

*Primary Examiner*—William A. Cuchlinski, Jr.
*Assistant Examiner*—McDieunel Marc
(74) *Attorney, Agent, or Firm*—Crowell & Moring LLP

(57) ABSTRACT

A device and method for delivering various substrates into a high-precision measuring instrument. The device comprises a magazine in which are configured several compartments in which substrate holders for different substrates can be deposited. Also provided is a loading station in which the substrate holders can be loaded with the substrate that matches the substrate holder. An automatic transfer device removes substrate holders from the magazine and introduces them into the loading station, or removes the substrate holders together with the introduced substrate from the loading station. The automatic transport device is configured as a robot arm at whose front end sits a fork.

17 Claims, 5 Drawing Sheets

DEVICE AND METHOD FOR DELIVERING VARIOUS TRANSPARENT SUBSTRATES INTO A HIGH-PRECISION MEASURING INSTRUMENT

CROSS REFERENCE TO RELATED APPLICATIONS

This invention claims priority of a German filed patent application 199 49 005.8, which is incorporated by reference herein.

FIELD OF THE INVENTION

The invention concerns a device for delivering various substrates into a high-precision measuring instrument. In particular, the invention concerns a device which comprises a magazine in which are configured several compartments in which substrate holders for different substrates can be deposited.

The invention further concerns a method for delivering various substrates into a high-precision measuring instrument.

BACKGROUND OF THE INVENTION

U.S. Pat. No. 5,026,239 describes a mask cassette and a loading mechanism for the mask cassette. A plurality of masks are stored in a mask cassette that can be sealed off from ambient air. The mask cassette is initially located in a mask chamber that communicates through a small opening with a main chamber. Both chambers are hermetically sealed toward the outside. In the mask chamber, the mask cassette is opened and is correspondingly brought into position so that a gripping and transport apparatus can access the individual masks. The masks are taken by the gripping and transport apparatus, through the small opening, into the main chamber, and there correspondingly exposed. The exposure in the present exemplary embodiment is with X-rays, so that both chambers must be evacuated for purity reasons.

A system for mask measurement is published in SPIE Vol. 3096; 0277-786X/97 (pp. 433 to 444). The system comprises an automatic loading apparatus for various substrate types. The various substrates are located in slide-in compartments in a magazine. Also provided is a magazine that possesses, above a turntable, three compartments, in each of which different substrate holders are deposited. The disadvantage of this system is that contaminants can occur as a result of the movable slide-in compartments, and can settle onto the substrates and thus disadvantageously influence the reproducibility of the measurement.

SUMMARY OF THE INVENTION

It is therefore the object of the invention to create a device with which the reproducibility of the measurement results can be greatly improved. It is intended by way of the present invention to alleviate the shortcomings of the existing art, for example the settling of particles on the substrates as the compartments of the magazine are moved, and to achieve a simplification of substrate handling for the operator and monitoring of thermal equilibrium.

In the case of a device of the kind cited initially, this object is achieved according to the present invention by a device comprising a magazine which defines several compartments in which substrate holders for various substrates can be deposited, a loading station in which the substrate holders can be loaded with the substrate that matches the substrate holder, and an automatic transfer device that removes substrate holders from the magazine and introduces them into the loading station, or removes the substrate holders together with the introduced substrate from the loading station.

A further object of the invention is to create a method with which substrates that are to be measured can be loaded into a high-precision measuring instrument, maximum reproducibility of the measurement results being guaranteed.

This object is achieved, in a method of the kind cited initially, in that the method comprises the following steps:
loading a specific substrate holder into the loading station;
introducing into the loading station a substrate type that matches the substrate holder;
checking conformity between the loaded substrate holder and introduced substrate type;
picking up the substrate in the substrate holder by way of the transport device; and
transferring the picked-up substrate holder, together with the loaded substrate, into the high-precision measuring instrument.

Advantageous developments are evident from the features of the dependent claims.

With the configuration according to the present invention of the measuring instrument known per se, it becomes possible to eliminate those aspects that in the past led to problems. (These related, for example, to particle deposits on the substrates upon insertion of the drawers into the magazine, since without "stoppers" the drawers could easily be pulled out. The storage compartments for the substrates were fairly tight; with larger substrates, it was very difficult to introduce the substrates by hand, or it was impossible to monitor whether a substrate was already present in a compartment.)

In order to ensure a reliable loading procedure, loading of the substrate holders is accomplished only via the loading station. In order to facilitate the operator's work in this context, the loading station is mounted at an ergonomic height of approx. 90–95 cm. The operator places the substrate onto the frame-shaped substrate holder inside the loading station. The support surfaces of the substrate holder for the substrate can be of very small dimensions, since the substrate is loaded entirely automatically onto the substrate holder. A magazine is loaded, exclusively with the aid of a robot arm, with the substrate holder including the substrates placed on it. There are no longer any drawers, preventing any further generation of particles that might contaminate the substrates in the compartments of the magazine. In addition, the possibility exists of integrating automatic loading from a carrier.

BRIEF DESCRIPTION OF THE DRAWINGS

The subject matter of the invention relating to the measuring instrument is depicted schematically in the drawings and will be described below with reference thereto. In the drawings.

DETAILED DESCRIPTION OF THE INVENTION

Figure 1:
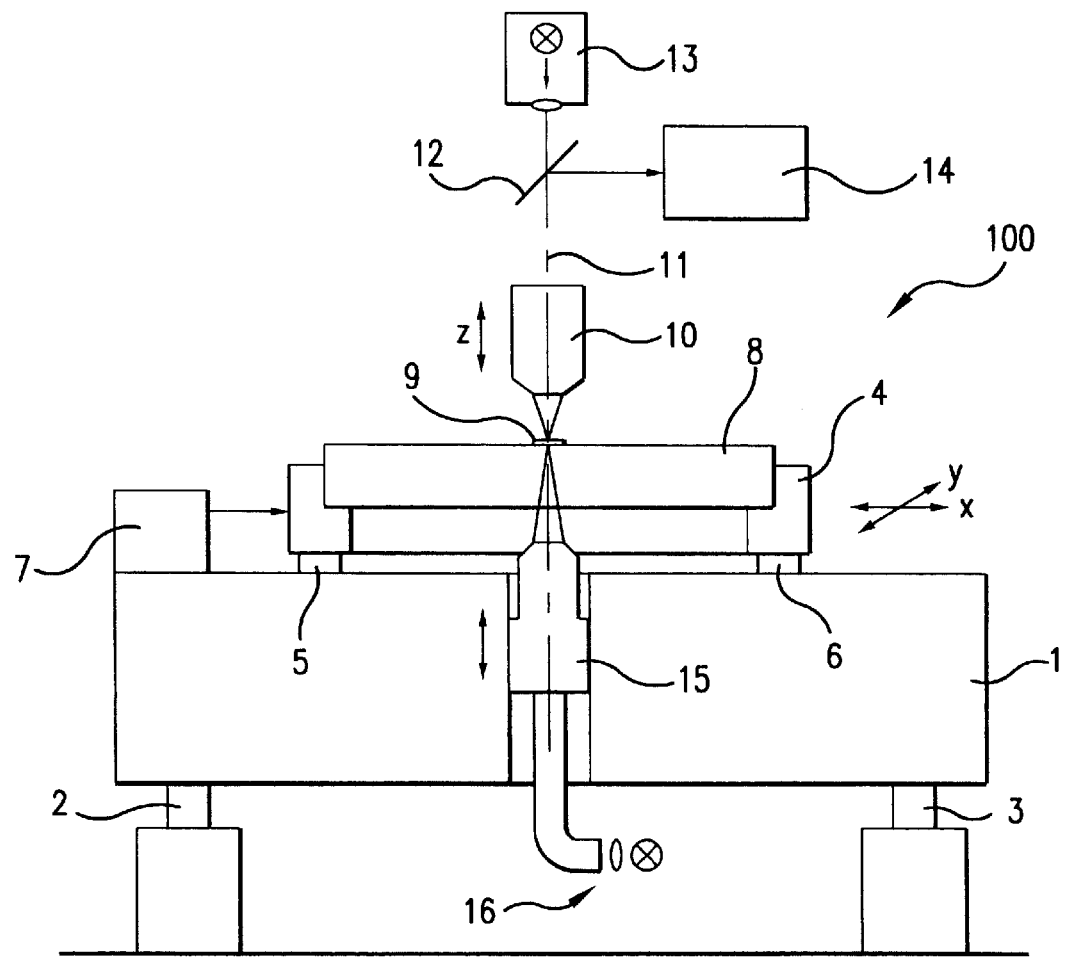
FIG. 1 shows a schematic side view of the measuring instrument.

The highly accurate measuring instrument 100 depicted in FIG. 1 comprises a granite block 1 that is mounted in vibration-damped fashion on bases 2, 3. On granite block 1, an X-Y carriage 4 configured as a frame is slidingly displaceable on air bearings 5, 6 in the two directions indicated by arrows. The frame of X-Y carriage 4 is preferably made of a ceramic with a low coefficient of thermal expansion. The drive systems for it are not depicted. The position of X-Y carriage is measured in the X and Y directions with a measurement system 7, preferably a laser system or glass scale. A substrate 8 is introduced into the frame of X-Y carriage 4. Substrate 8 is made, for example, of glass (preferably quartz glass). Patterns 9 are present on the substrate surface. Since X-Y carriage 4 is configured as a frame, substrate 8 can also be transilluminated from below. For substrates that are opaque, incident illumination is then accomplished. The description hereinafter is limited to the illumination of light-transmissive substrates. This is not to be construed in any way as a limitation of the invention.

Located above substrate 8 is an imaging system 10 of high optical quality that is adjustable in the Z direction along its optical axis 11 for focusing. By way of a beam-splitter mirror 12, on the one hand the light of a light source 13 is introduced into the optical beam path, and on the other hand the imaging beams are directed onto a detector device 14. Detector device 14 is, for example, a CCD camera having a high-resolution pixel array. Light source 13 emits in the near UV spectral region. Set into granite block 1 is a further illumination device that comprises an adjustable-height condenser 15 and a light source 16. The exit surface of a light guide can also be provided as light source 16. The optical axis of condenser 15 is aligned with optical axis 11 of imaging system 10. The height adjustment of condenser 15 with light source 16 is used to adapt the illumination beams being directed onto pattern 9 to different optical thicknesses of substrates 8. The condenser head can, in particular, extend into the open part of the frame of X-Y carriage 4. In order to prevent damage during stage displacements over the entire substrate surface, it can be pulled beneath the surface of granite block 1. Light sources 13 and 16 can be activated independently of one another.

Figure 2:
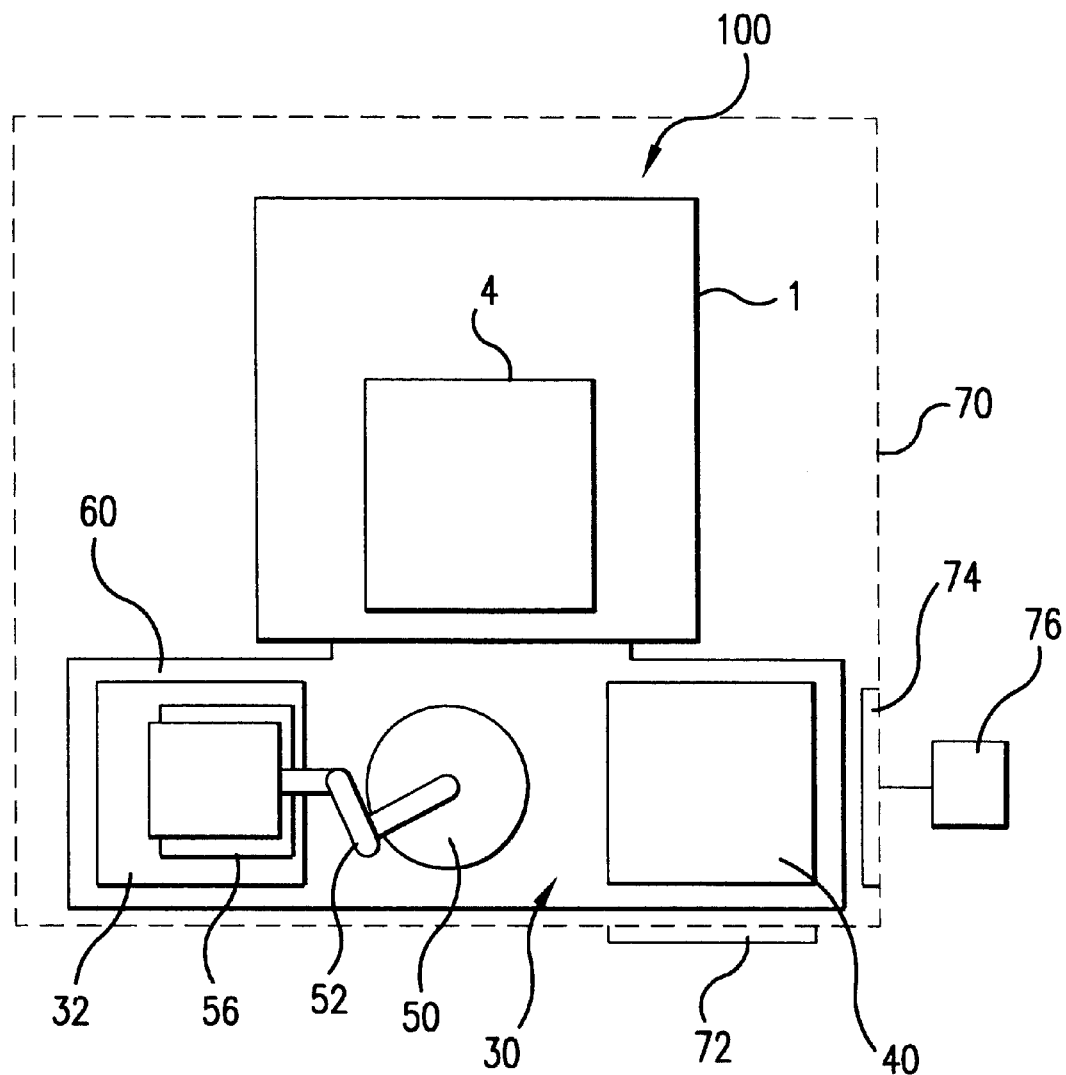
FIG. 2 shows a schematic depiction of the configuration of the device.

A schematic depiction of high-precision measuring instrument 100 with several additional devices is depicted in FIG. 2. As already mentioned in the description of FIG. 1, X-Y carriage 4 is located on granite block 1. In order to avoid unnecessary complication of the schematic depiction of the device, several components of high-precision measuring instrument 100 are not depicted. Substrates 8 intended for measurement can be loaded onto X-Y carriage 4. A magazine 32, in which multiple compartments (not depicted) are configured, is provided for loading substrates 8 into high-precision measuring instrument 100. Substrate holders 34 for the various substrate types are deposited in the compartments. In addition, it is also possible for substrate holders 34 with an introduced substrate 8 to be placed into the compartments. A first reason why substrate holders 34 with an introduced substrate 8 are deposited into magazine 32 is that a temperature equilibrium must be achieved for highly accurate measurement. A second reason is that all the substrates 8 to be measured are temporarily stored, in the corresponding substrate holders 34, in the compartments of magazine 32 for later processing.

A loading station 40 (see FIG. 3 for a more detailed description) is also provided in the physical vicinity of magazine 32. Located between magazine 32 and loading station 40 is an automatic transport device 50 which is configured such that it can introduce substrate holders 34 into the loading station; can transfer substrate holders 34, together with the introduced substrate 8, into magazine 32 or into high-precision measuring instrument 100; or can remove substrate holders from high-precision measuring instrument 100. Automatic transport device 50 possesses a robot arm 52 at whose front end 54 is configured a fork 56 with which substrate holders 34 can be picked up and transported.

In the exemplary embodiment depicted here, magazine 32, automatic transport device 50, and loading station 40 are mounted on a platform 60. By way of platform 60 a defined position of the individual elements (magazine 32, automatic transport device 50, loading station 40, and high-precision measuring instrument 100) with respect to one another is always guaranteed. A further advantage of installation on platform 60 is that magazine 32, automatic transport device 50, and loading station 40 can be uncoupled very quickly from high-precision measuring instrument 100, so that better access for service personnel to high-precision measuring instrument 100 can be achieved. In addition, platform 60 docked onto high-precision measuring instrument 100 always allows correct alignment or adjustment of the individual elements.

If necessary because of measurement conditions, high-precision measuring instrument 100, magazine 32, automatic transport device 50, and loading station 40 are housed in a climate-controlled chamber 70. The climate-controlled chamber is defined by multiple partitions 71, of which only the side partitions are depicted in FIG. 2. Climate-controlled chamber 70 is equipped in the region of loading station 40 with a sealable loading opening 72 through which an operator can load substrates from outside into loading station 40. In a further embodiment, a further transfer interface 74 is additionally provided in the region of loading station 40 which lies opposite partitions 71 of climate-controlled chamber 70. At this transfer interface 74, for example, an automatic loading system 76 can be placed. Automatic loading system 76 then inserts the various substrates 8 in succession from a transport container into loading station 40. Automatic loading system 76 can be implemented, for example, with an automated guided vehicle or transport carriage, specifically in such a way that the automated guided vehicle or transport carriage is brought into communication with transfer interface 74.

Exemplary embodiments of magazine 32, automatic transfer device 50, and loading station 40 will be disclosed below.

Magazine 32 is designed for eight to ten compartments for eight to ten substrate holders 80 or wafer chucks (not depicted); the exact number depends on the availability and cost of automatic transport device 50 and, if necessary, on the interior height of climate-controlled chamber 70. The external dimensions of substrate holders 80 are the same for all substrates or wafers. To identify the type of substrate holder 80, a code is applied to the outer side. To simplify process monitoring for the entire measurement system, multiple sensors (not depicted) are provided. One sensor reads the code (not depicted) on substrate holder 80, to identify which substrate holder type is deposited in which compartment of magazine 32. In addition, temperature sensors (not depicted) are provided in each compartment of magazine 32. The temperature sensors do not need to be absolutely calibrated. Their purpose is simply to monitor whether the substrate temperature has stabilized so that a reproducible measurement can be performed. In addition, substrate-exists sensors (not depicted) can be present in each compartment, indicating whether a substrate is present in substrate holder 8.

Automatic transport device 50 handles substrates 8 with substrate holders 34, or wafers with wafer chucks. The weight to be transported can be up to 4 kg. The automatic transport device possesses a robot arm that has a maximum lever length of 500 mm with a rotation angle of 190°. Only a single fork 56 is provided for use on the robot arm, since the external dimensions of all substrate holders 80 for all substrates 8 and wafers are the same. There is no need to replace fork 56 between one substrate type and another. It is possible to mount on one side of fork 56, for example, a sensor that identifies substrate holder 80.

Loading station 40 is physically designed in such a way that the operator can easily load and unload substrate holders 80 with substrates 8 by hand.

The sequence of loading a substrate holder 80 with a corresponding substrate 8 is depicted in FIGS. 3a through 3d.

Figure 3A:
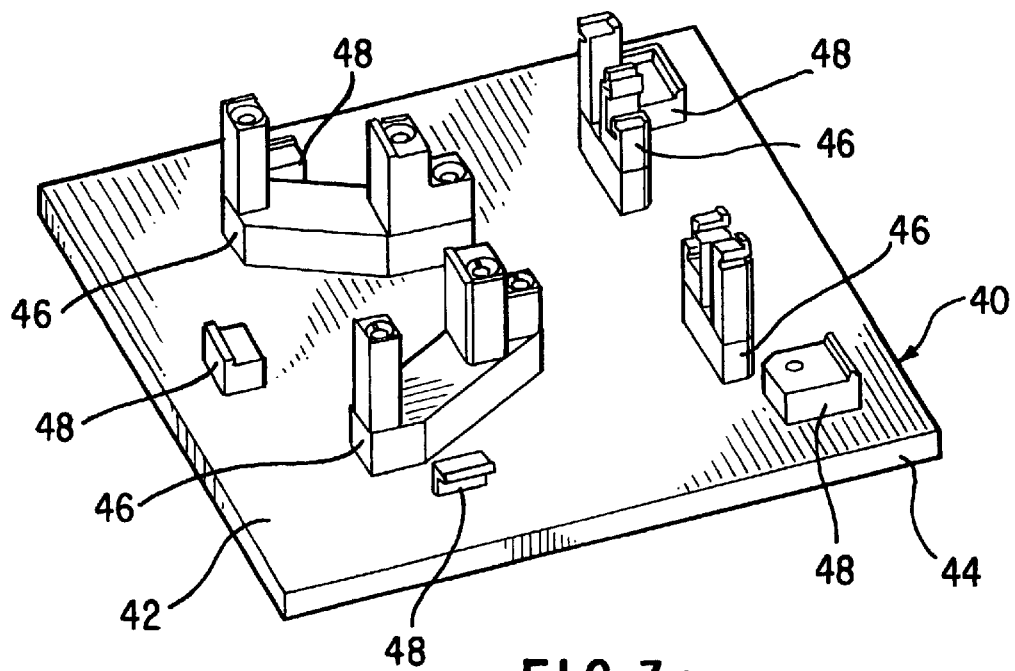
FIGS. 3a through 3d show a graphic depiction of a substrate being picked up in the loading station of the device.

FIG. 3a shows a perspective depiction of loading station 40. Loading station 40 comprises a base plate 42 on which a peripheral rim 44 is configured. Arranged on base plate 44 are multiple support means 46 which are distributed on base plate 44 in such a way as to guarantee a stable support for substrates 8. In the present case, four support means 46 are provided. Also mounted on the base plate in addition to support means 46 are receiving elements 48 which support a substrate holder 80 (see FIG. 3b) in such a way that it surrounds support means 46 and is aligned and oriented in terms of its position. The alignment of substrate holder 80 is defined by receiving elements 48.

Figure 3B:
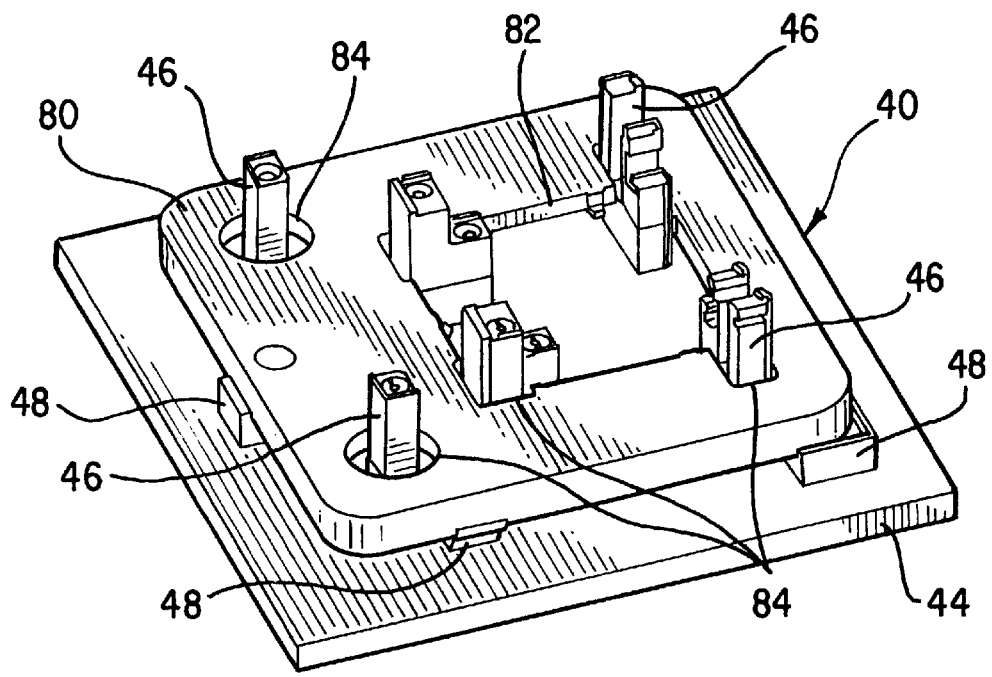

FIG. 3b shows substrate holder 80 introduced into loading station 40. Substrate holder 80 has defined an opening 82 that is determined in accordance with the length and width of substrates 8 being used. Additionally provided in substrate holder 80 are guide openings 84 which are arranged in substrate holder 80 in such a way that they correspond to the three-dimensional arrangement of support means 46 of loading station 40. Upon placement of substrate holder 80 into loading station 40, parts of support means 46 engage into guide openings 84 of substrate holder 80 and thereby ensure approximate guidance of the substrate holder. Guide openings 84 are dimensioned such that a clearance exists between them and support means 46. Once substrate holder 80 has been placed into loading station 40, it then rests on receiving elements 48 which align and position it exactly.

Figure 3C:
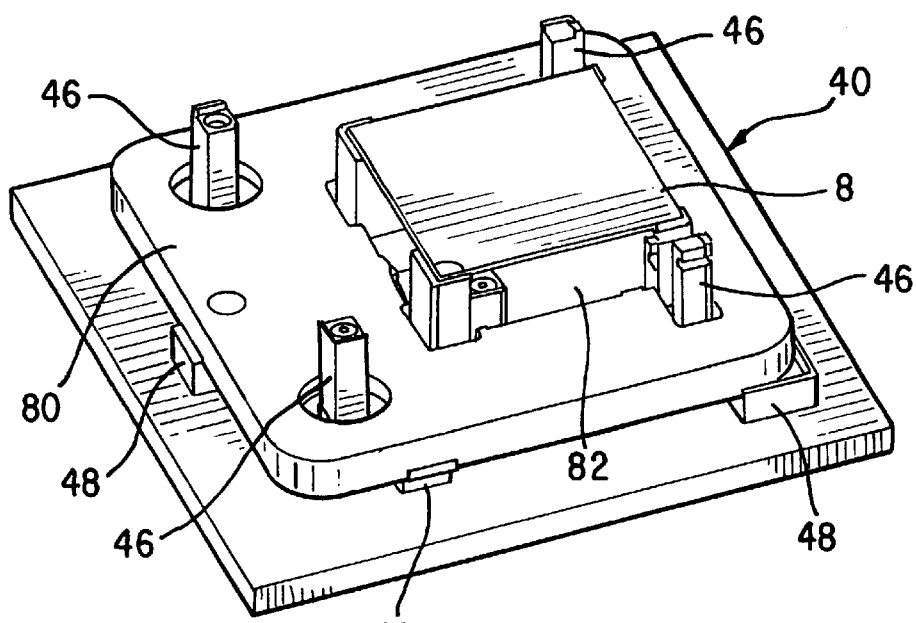

FIG. 3c shows a substrate holder 80 located in loading station 40, and a substrate 8 resting on support means 46. Substrate 8 is selected in accordance with substrate holder 80 so that it fits into opening 82 of substrate holder 80. Suitable means (sensors, data processing system) can also be provided to check the conformity between substrate 8 and substrate holder 80. Substrate 8 is introduced by an operator, by hand or with a suitable tool, into loading station 40. The introduction of substrate 8 can also be automated.

Figure 3D:
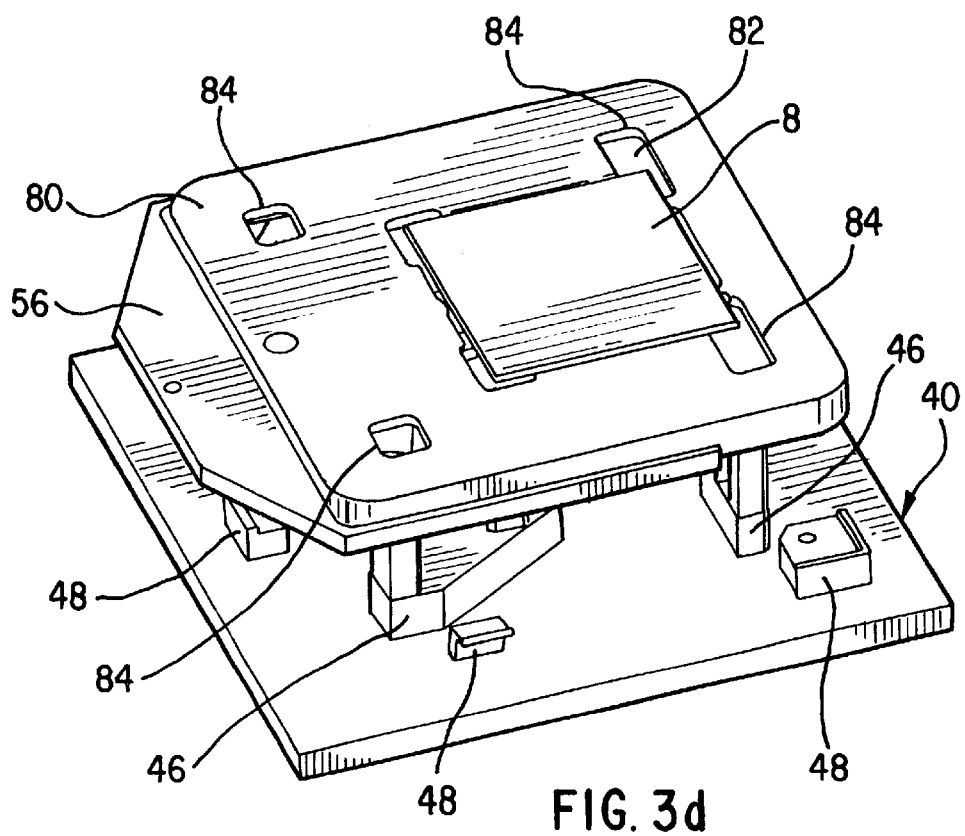

FIG. 3d shows substrate holder 80 being lifted off together with an introduced substrate 8. If substrate holder 80 and substrate 8 are in conformity, substrate holder 80 can be lifted off from loading station 40. For this purpose, fork 56 of robot arm 52 (not depicted) travels under substrate holder 80 that is resting on receiving elements 48. As a result of the lifting movement of robot arm 52, fork 56 lifts up substrate holder 80 which thereby carries with it substrate 8 located in loading station 40. Substrate 8 comes to rest in opening 82 of substrate holder 80. The lifting movement of robot arm 56 also causes support means 46 of loading station to be moved out of guide openings 84 of substrate holder 80. The unit made up of substrate holder 80 and substrate 8 can now be transferred by robot arm 52 into high-precision measuring instrument 100 or into magazine 32 (FIG. 2).

Figure 4:
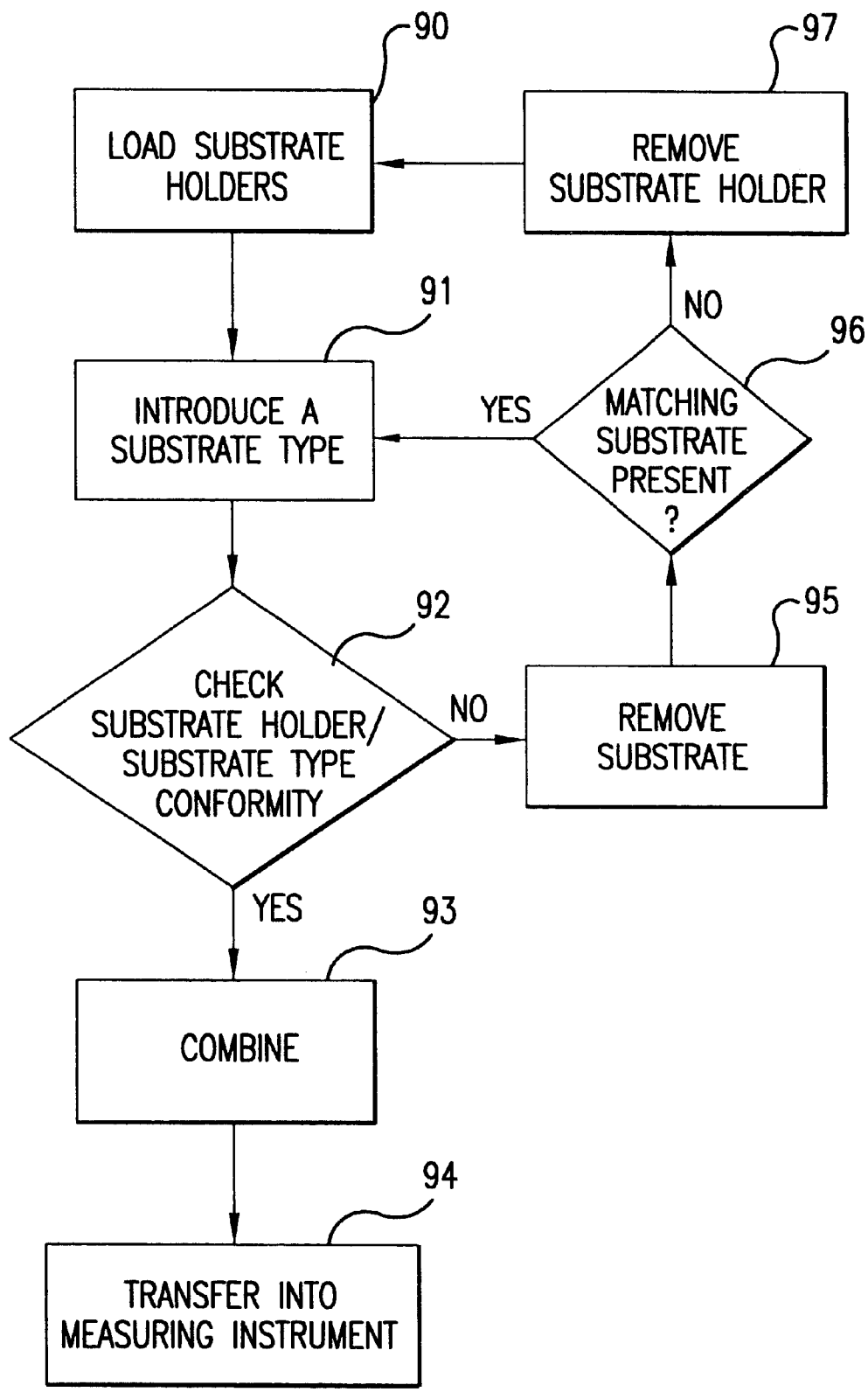
FIG. 4 shows a flow chart depicting the method according to the present invention.

FIG. 4 discloses, in a flow chart, the method for introducing various substrates into a high-precision measuring instrument. In a first step 90, loading of a specific substrate holder 80 into loading station 40 is accomplished. As already mentioned above, an automatic transport device 50 is used for this purpose. In a second step 91, a substrate 8 of a specific substrate type is introduced into loading station 40. The introduction of a substrate 8 into the loading station can be performed automatically or manually by an operator. In a third step 92, a check is made as to whether substrate holder 80 matches the introduced substrate 8. Suitable sensors which are connected to a data processing system can be provided for this purpose. If conformity is ascertained, execution continues with a fourth step 93, in which substrate holder 80 is lifted up by way of fork 56 of robot arm 52. Substrate 8 thereby comes to rest in opening 82 of substrate holder 80. In a fifth step 94, substrate holder 90 is then transferred, together with substrate 8, into measuring instrument 100. It is also conceivable, however, for substrate holder 80 together with substrate 8 first to be deposited in a compartment of magazine 32 for temperature stabilization. Once a temperature equilibrium has been reached, substrate holder 80 together with substrate 8 is introduced into measuring instrument 100. If it was found in third step 92 that the substrate type did not conform to substrate holder 80, a sixth step 95 is performed. Substrate 8 is removed from loading station 40 (by hand or automatically). This is followed by a seventh step 96 in which a check is made as to whether a matching substrate 8 is present for substrate holder 80 that is present in loading station 40. If so, the process executes again from second step 91. If it was found that a matching substrate 8 is not present, an eighth step 97 is performed. Substrate holder 80 is removed from loading station 40, and a substrate holder 80 that matches substrate 8 which is present is put in place. The process then executes again from first step 90.

The present invention was described with reference to exemplary embodiments. It is nevertheless apparent to any person skilled in this art that changes and modifications can be made without thereby leaving the range of protection of the claims recited below.

PARTS LIST

1 Granite block
2 Base
3 Base
4 X-Y carriage
5 Air bearing
6 Air bearing
7 Measurement system
8 Substrate
9 Patterns
10 Imaging system
11 Optical axis
12 Beam-splitter mirror
13 Light source
14 Detector device
15 Adjustable-height condenser
16 Light source
30 Device
32 Magazine
34 Substrate holder
40 Loading station
42 Base plate
44 Peripheral rim
46 Support means
48 Receiving elements 50 Automatic transfer device
52 Robot arm
54 Front end
56 Fork
60 Platform
70 Climate-controlled chamber
71 Partitions
72 Loading opening
74 Transfer interface
76 Automatic loading system
80 Substrate holder
82 Opening
84 Guide openings
90 First step
91 Second step
92 Third step
93 Fourth step
94 Fifth step
95 Sixth step
96 Seventh step
97 Eighth step
100 High-precision measuring instrument

What is claimed is:

1. A device for delivering various substrates (8) into a high-precision measuring instrument (100), comprising a magazine (32) which defines several compartments in which substrate holders (80) for various substrates (8) can be deposited,
    a loading station (40) in which the substrate holders (80) can be loaded with the substrate (8) that matches the substrate holder (80), and an automatic transfer device (50) that removes substrate holders (80) from the magazine (32) and introduces them into the loading station (40), or removes the substrate holders (80) together with the introduced substrate (8) from the loading station (40).

2. The device as defined in claim 1, wherein the substrate (8) can be transferred, together with the substrate holder (80), from the loading station (50) into the measuring instrument (100).

3. The device as defined in claim 1, wherein substrate holders (80) alone, and substrate holders (80) together with a substrate (8), can be deposited in the magazine (32).

4. The device as defined in claim 1, wherein the automatic transport device (50) is configured as a robot arm (52) at whose front end a fork (56) is configured.

5. The device as defined in claim 1, wherein the magazine (32), the automatic transport device (50), and the loading station (40) are mounted and aligned on a platform (60); and the platform (60) can be docked onto the measuring instrument (100).

6. The device as defined in claim 1, wherein the loading station (40) is physically arranged in such a way that the substrates (8) can be deposited in the loading station (40), or removed therefrom, by an operator.

7. The device as defined in claim 6, wherein the loading station (40) is physically arranged such that the substrates can be introduced into the loading station (40), or removed therefrom, by an automatic transfer device (50).

8. The device as defined in claim 1, wherein the compartments of the magazine (32) are configured such that both substrate holders (80) alone, and substrate holders (80) with an introduced substrate (8), can be deposited in the compartments.

9. The device as defined in claim 1, wherein a temperature sensor is provided in each of the compartments of the magazine (32).

10. The device as defined in claim 1, wherein the measuring instrument (100), the magazine (32), the loading station (40), and the automatic transport device (50) are arranged in a climate-controlled chamber (70).

11. A method for delivering various substrates (8) into a high-precision measuring instrument (100), characterized by the following steps:
    loading a specific substrate holder (80) into a loading station (40);
    introducing into the loading station (40) a substrate type that matches the substrate holder (80);
    checking conformity between the loaded substrate holder (80) and introduced substrate type;
    picking up the substrate (8) in the substrate holder (80) by way of the transport device (50); and
    transferring the substrate holder (80), together with the picked-up substrate (8), into the high-precision measuring instrument (100).

12. The method as defined in claim 11, wherein loading of a specific substrate (8) into the loading station (40) can be accomplished by an automatic transport device (50) and manually.

13. The method as defined in claim 11, wherein the substrate holder (8) is transferred together with the picked-up substrate (8) into a magazine compartment, and is stored there for later processing.

14. The method as defined in claim 13, wherein in each magazine compartment, the temperature equilibrium of each substrate holder (80) with substrate (8) is ascertained by a temperature sensor; and the substrate holder (80) and substrate (8) are transferred into the measuring instrument (100) only after temperature equilibrium has been reached.

15. The method as defined in claim 11, wherein checking of the conformity between loaded substrate holder (80) and introduced substrate (8) is achieved by the fact that corresponding sensors, which ascertain the type of the loaded substrate (8) and compare it to the substrate holder (80), are provided in the loading station (40).

16. The method as defined in claim 11, wherein transferring of the substrate holder (80) together with the substrate (8) into the high-precision measuring instrument is accomplished by way of an automatic transfer device (50) which has a robot arm (52) configured for that purpose.

17. The method as defined in claim 11, wherein a transfer interface (74) is provided at which is placed an automatic loading system (76) that automatically introduces the various substrates (8) successively from a transport container into the loading station (40).

* * * * *